(12) United States Patent
Hsu

(10) Patent No.: US 11,749,669 B2
(45) Date of Patent: Sep. 5, 2023

(54) SEMICONDUCTOR DEVICE, CAPACITOR DEVICE AND MANUFACTURE METHOD OF CAPACITOR DEVICE

(71) Applicant: CHANGXIN MEMORY TECHNOLOGIES, INC., Hefei (CN)

(72) Inventor: Cheng-Hung Hsu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 65 days.

(21) Appl. No.: 17/455,498

(22) Filed: Nov. 18, 2021

(65) Prior Publication Data

US 2022/0077133 A1   Mar. 10, 2022

Related U.S. Application Data

(63) Continuation of application No. PCT/CN2021/093134, filed on May 11, 2021.

(30) Foreign Application Priority Data

Jun. 19, 2020 (CN) .......................... 202010565258.1

(51) Int. Cl.
  *H01L 27/108* (2006.01)
  *H01L 27/01* (2006.01)
(52) U.S. Cl.
  CPC ................................ *H01L 27/016* (2013.01)
(58) Field of Classification Search
  None
  See application file for complete search history.

(56) References Cited

U.S. PATENT DOCUMENTS

| 8,158,485 B2 | 4/2012 | Kohler et al. |
| 10,354,803 B2 | 7/2019 | Komeda et al. |

(Continued)

FOREIGN PATENT DOCUMENTS

| CN | 1638131 A | 7/2005 |
| CN | 103151244 A | 6/2013 |

(Continued)

OTHER PUBLICATIONS

Written Opinion of the International Search Authority in the corresponding international application No. PCT/CN2021/093134, dated Jul. 19, 2021.

(Continued)

*Primary Examiner* — Benjamin P Sandvik
(74) *Attorney, Agent, or Firm* — COOPER LEGAL GROUP, LLC

(57) ABSTRACT

The present disclosure provides a semiconductor device, and a capacitor device and its manufacture method, and relates to the field of semiconductor technologies. The manufacture method includes: forming, on a substrate, a plurality of storage node contact plugs distributed in an array and an insulation layer separating each of the storage node contact plugs; forming an electrode supporting structure on a side of the insulation layer away from the substrate, the electrode supporting structure having a plurality of through holes exposing each of the storage node contact plugs respectively, the through hole comprising a plurality of hole segments end-to-end jointing successively, the hole segment located on a side close to the substrate having an aperture greater than the hole segment located on a side away from the substrate; forming a dielectric layer; forming a second electrode layer.

17 Claims, 16 Drawing Sheets

(56) References Cited

U.S. PATENT DOCUMENTS

| | | | |
|---|---|---|---|
| 2004/0018679 A1* | 1/2004 | Yu | H01L 28/91 |
| | | | 438/254 |
| 2004/0175884 A1 | 9/2004 | Veerasingam | |
| 2008/0003740 A1* | 1/2008 | Wunnicke | H01L 28/91 |
| | | | 438/238 |
| 2009/0294907 A1* | 12/2009 | Tegen | H01L 28/90 |
| | | | 438/386 |
| 2011/0062552 A1* | 3/2011 | Tsuchiya | H10B 12/315 |
| | | | 257/532 |
| 2011/0306197 A1 | 12/2011 | Kim | |
| 2012/0125879 A1* | 5/2012 | Park | H01G 11/22 |
| | | | 216/6 |
| 2012/0168903 A1 | 7/2012 | Manning | |
| 2013/0323902 A1 | 12/2013 | Lee | |
| 2020/0211834 A1* | 7/2020 | Yang | C23C 16/0209 |
| 2021/0036101 A1* | 2/2021 | Choi | H01L 28/92 |
| 2021/0118705 A1* | 4/2021 | Choi | H10B 12/31 |

FOREIGN PATENT DOCUMENTS

| | | |
|---|---|---|
| CN | 107706181 A | 2/2018 |
| CN | 209785930 U | 12/2019 |
| CN | 111223843 A | 6/2020 |
| JP | 2011181664 A | 9/2011 |
| JP | 2014045003 A | 3/2014 |
| KR | 20040001960 A | 1/2004 |
| KR | 20040059766 A | 7/2004 |
| KR | 100744641 B1 | 8/2007 |

OTHER PUBLICATIONS

International Search Report as cited in PCT Application No. PCT/CN2021/093134 dated Jul. 19, 2021, 5 pages.

First Office Action of the Chinese application No. 202010565258.1, dated Jun. 28, 2023. 10 pages.

* cited by examiner

SEMICONDUCTOR DEVICE, CAPACITOR DEVICE AND MANUFACTURE METHOD OF CAPACITOR DEVICE

CROSS REFERENCE TO RELATED APPLICATION

This application is a continuation application of International Patent Application No. PCT/CN2021/093134, filed on May 11, 2021, which claims priority to Chinese Patent Application No. 202010565258.1, filed with the Chinese Patent Office on Jun. 19, 2020 and entitled "SEMICONDUCTOR DEVICE, CAPACITOR DEVICE AND MANUFACTURE METHOD OF CAPACITOR DEVICE." International Patent Application No. PCT/CN2021/093134 and Chinese Patent Application No. 202010565258.1 are incorporated herein by reference in their entireties.

FILED OF THE INVENTION

The present disclosure relates to the field of semiconductor technologies, in particular to a semiconductor device, and a capacitor device and a manufacture method of a capacitor device.

BACKGROUND OF THE INVENTION

A capacitor, as one of essential elements in an integrated circuit, has functions of holding charges, adjusting a voltage, filtering, etc., in a circuit. With continuous reduction in a size of a semiconductor device, in order to guarantee enough capacitance, a height of an electrode is generally required to be increased, such that an aspect ratio of the electrode is enlarged. However, in a manufacturing process, a top of the electrode is likely to deform due to an effect of manufacture technologies, thereby causing short circuit due to a contact of the electrodes of the adjacent capacitors.

It is to be noted that the above information disclosed in this Background section is only for enhancement of understanding of the background of the present disclosure and therefore it may contain information that does not form the related art that is already known to a person of ordinary skill in the art.

SUMMARY OF THE INVENTION

An objective of the present disclosure is to provide a semiconductor device, and a capacitor device and its manufacture method, and then address, at least to some extent, one or more problems due to limitations and defects in a related art.

According to one aspect of the present disclosure, a method of manufacturing a capacitor device is provided, the method including:

forming, on a substrate, a plurality of storage node contact plugs distributed in an array and an insulation layer separating each of the storage node contact plugs;

forming an electrode supporting structure on a side of the insulation layer away from the substrate, the electrode supporting structure having a plurality of through holes exposing each of the storage node contact plugs respectively, the through hole including a plurality of hole segments end-to-end jointing successively, the hole segment on a side close to the substrate having an aperture greater than the hole segment on a side away from the substrate, such that a space between walls of two adjacent through holes is greater on the side away from the substrate than the side close to the substrate;

forming a first electrode layer in each of the through holes, the first electrode layer being in a contact connection with the storage node contact plug;

forming a dielectric layer on outer and inner surfaces of a structure formed collectively by the first electrode layer and the electrode supporting structure; and forming a second electrode layer on an outer surface of the dielectric layer.

According to one aspect of the present disclosure, a capacitor device is provided, the capacitor device including:

a substrate, a plurality of storage node contact plugs distributed in an array and an insulation layer separating each of the storage node contact plugs being formed on the substrate;

an electrode supporting structure formed on a side of the insulation layer away from the substrate, the electrode supporting structure having a plurality of through holes exposing each of the storage node contact plugs respectively, the through hole including a plurality of hole segments end-to-end jointing successively, the hole segment on a side close to the substrate having an aperture greater than the hole segment on a side away from the substrate, such that a space between walls of two adjacent through holes is greater on the side away from the substrate than the side close to the substrate;

a first electrode layer formed in each of the through holes, the first electrode layer being in a contact connection with the storage node contact plug; a dielectric layer formed on outer and inner surfaces of a structure formed collectively by the first electrode layer and the electrode supporting structure; and a second electrode layer formed on an outer surface of the dielectric layer.

According to one aspect of the present disclosure, a semiconductor device is provided, the semiconductor device including any one of the capacitor device described above.

BRIEF DESCRIPTION OF THE DRAWINGS

The accompanying drawings herein are incorporated in and constitute a part of this specification, illustrate embodiments conforming to the present disclosure and, together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

Figure 1:
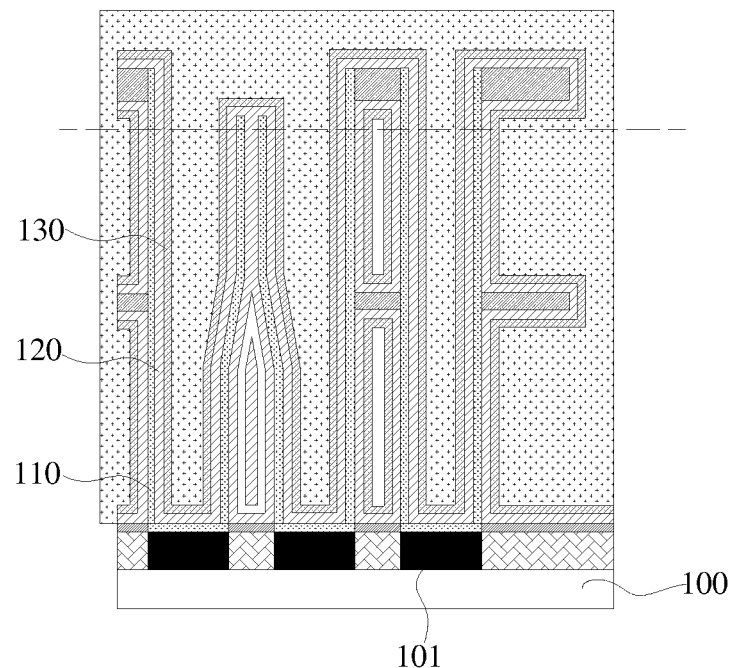
FIG. 1 is a schematic structural diagram of a capacitor device in a related art.

In the drawings: 100 substrate; 101 storage node contact plug; 110 lower electrode layer; 120 insulation layer; 130 upper electrode layer; 1 substrate; 11 storage node contact plug; 2 insulation layer; 2 electrode supporting structure; 21 first supporting layer; 22 first sacrificial layer; 23 second supporting layer; 24 second sacrificial layer; 25 third supporting layer; 221 first hole segment; 210 preset hole; 2101 through hole; 211 blocking material; 220 barrier layer; 3 first electrode layer; 4 dielectric layer; 5 second electrode layer; 6 protection layer; 7 semiconductor layer.

DETAILED DESCRIPTION OF THE EMBODIMENTS

The exemplary embodiments will now be described more fully with reference to the accompanying drawings. However, the exemplary embodiments can be implemented in a variety of forms and should not be construed as limited to the embodiments set forth herein. Rather, the embodiments are provided so that the present disclosure will be thorough and complete and will fully convey the concepts of exemplary embodiments to those skilled in the art. Throughout the drawings, similar reference signs indicate the same or similar structures, and their detailed description will be omitted.

Although relative terms such as "above" and "below" are used herein to describe a relative relation between one component and another component of icons, these terms are merely for convenience of this specification, for example, the directions of the examples in the accompanying drawings. It is to be understood that when the apparatus of the icon is turned upside down, components described as "above" will become components described as "below". When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc. The terms "first", "second", and "third" are merely used as labels, and not a limitation to the number of indicated objects.

Figure 2:
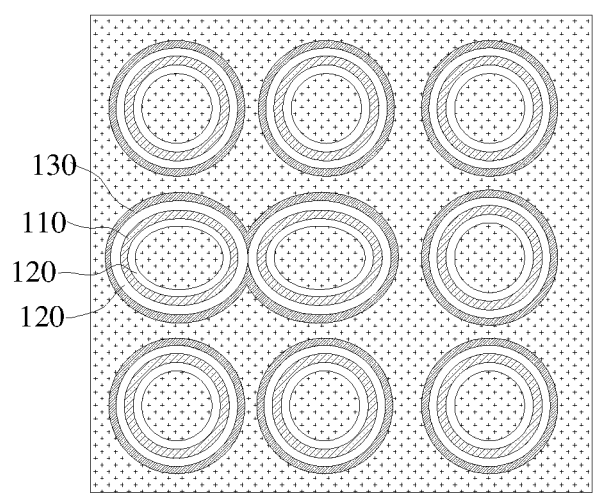
FIG. 2 is a cutaway view corresponding to a position of a dashed line shown in FIG. 1.

In a related art, as shown in FIGS. 1 and 2, a capacitor device mainly includes a storage node contact plug 101, a lower electrode layer 110, an insulation layer 120, and an upper electrode layer 130, which are disposed on a substrate 100, wherein the lower electrode layer 110 is in a contact connection with and aligned with the storage node contact plug 101. In order to guarantee a capacitance, the lower electrode layer 110 is designed to be of a high aspect ratio structure having a consistent width, and the insulation layer 120 and the upper electrode layer 130 successively follow a shape of and fit on a surface of the lower electrode layer 110. However, in a product manufacture process, in the case where a formation of a high aspect ratio structure is desirable, it is typically required to wet etch auxiliary materials used in a formation of the lower electrode layer 110, so as to remove unnecessary auxiliary materials; at this time, a side of the lower electrode layer 110 away from the substrate 100 lacks of support and thus, deforms towards two sides thereof under an effect of a liquid tension, causing a decreased space between the lower electrode layers 110 of two adjacent capacitors on a side away from the substrate 100, causing a short circuit phenomenon when the insulation layer 120 and the upper electrode layer 130 are formed.

Figure 3:
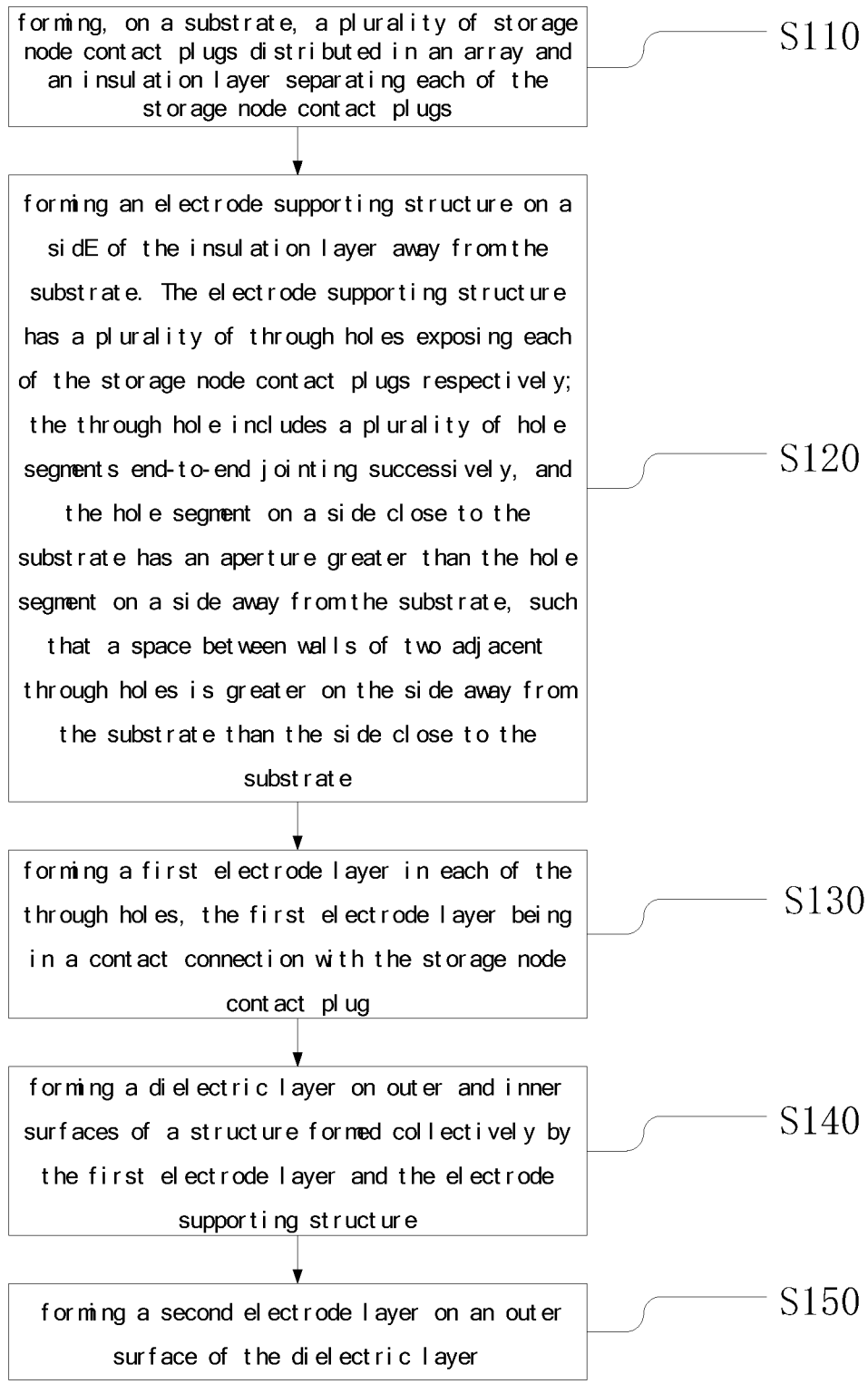
FIG. 3 is a flow diagram of a method of manufacturing a capacitor device according to an embodiment of the present disclosure.

An embodiment of the present disclosure provides a method of manufacturing a capacitor device, as shown in FIG. 3. The manufacture method may include the following steps.

Step S110: forming, on a substrate, a plurality of storage node contact plugs distributed in an array and an insulation layer separating each of the storage node contact plugs.

Step S120: forming an electrode supporting structure on a side of the insulation layer away from the substrate. The electrode supporting structure has a plurality of through holes exposing each of the storage node contact plugs respectively; the through hole includes a plurality of hole segments end-to-end jointing successively, and the hole segment on a side close to the substrate has an aperture greater than the hole segment on a side away from the substrate, such that a space between walls of two adjacent through holes is greater on the side away from the substrate than the side close to the substrate.

Step S130: forming a first electrode layer in each of the through holes, the first electrode layer being in a contact connection with the storage node contact plug.

Step S140: forming a dielectric layer on outer and inner surfaces of a structure formed collectively by the first electrode layer and the electrode supporting structure.

Step S150: forming a second electrode layer on an outer surface of the dielectric layer.

In a method of manufacturing a capacitor device according to the present disclosure, on one hand, the electrode supporting structure may clad on the outer periphery of the first electrode layer and laterally support the first electrode layer, increasing an lateral stability of the first electrode layer and preventing the first electrode layer from a lateral deformation; on the other hand, since a hole segment of the hole segments on a side close to the substrate has a greater aperture than a hole segment on a side away from the substrate, such that in the first electrode layer formed in each of the through holes, a portion thereof close to the substrate has an aperture greater than a portion thereof away from the substrate, and then a space between the first electrodes formed in two adjacent through holes is greater on the side away from the substrate than the side close to the substrate, increasing a lateral space between two adjacent first electrode layers on a side away from the substrate; the first electrode layer would not contact an electrode located in an adjacent through hole even if subjecting to a deformation towards both sides due to subsequent processes, avoiding short circuit; meanwhile, since the first electrode layer has a large size at its bottom, provided is an increased contact area between the first electrode and the dielectric layer, improving capacitance.

Steps of the manufacture method according to embodiments of the present disclosure are described below in detail.

In step S110, a plurality of storage nodes contact plugs distributed in an array and an insulation layer separating each of the storage node contact plugs are formed on a substrate.

Figure 4:
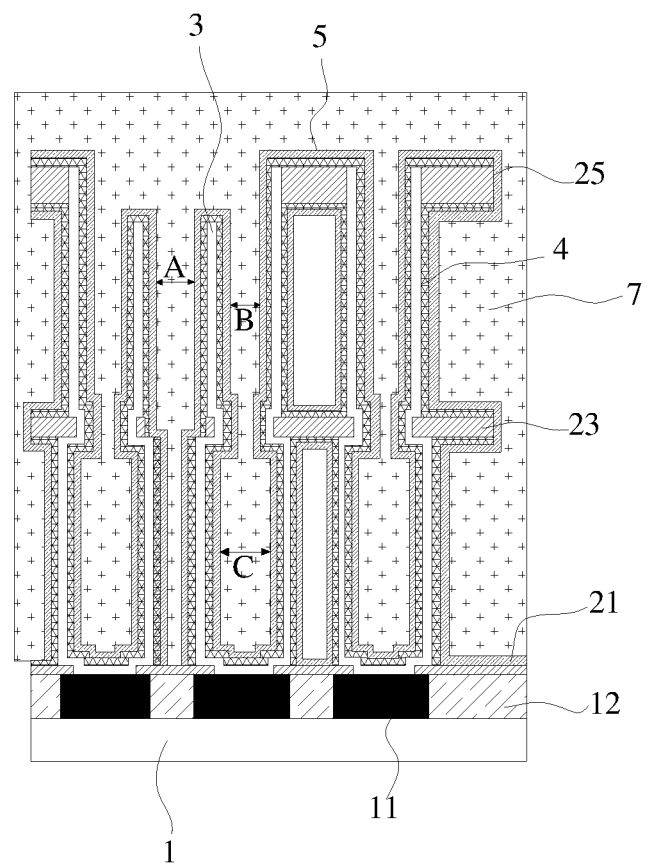
FIG. 4 is a schematic diagram of a capacitor device according to an embodiment of the present disclosure.

In an embodiment of the present disclosure, as shown in FIG. 4, the substrate 1 may be of a slabbed structure, which may have a shape of rectangle, circle, oval, polygon or irregular figure, and materials of which may be silicon or other semiconductor materials. The shape and material of the substrate 1 are not specifically limited here.

An insulation layer 12 may be formed on the substrate 1. For example, vacuum evaporation, magnetron sputtering or chemical vapor deposition may be used to form the insulation layer 12 on the substrate 1. Certainly, other methods may also be used to form insulation layer 12, and are not further enumerated herein. The insulation layer 12 may have a same shape as the substrate 1, and materials thereof may be silicon nitride, silicon oxide or the like, and are not specifically limited here. The insulation layer 12 may be provided with a plurality of opening distributed in an array. Each of the openings may be of a shape of circle, and may also have a shape of rectangle or irregular figure, which is not specifically limited here. In an embodiment of the present disclosure, the openings may have a shape of circle, and a storage node contact plug 11 for storing electric energy may be formed in each of the openings, and the storage node contact plugs 11 may be made of semiconductor materials, which may be poly silicone, for example.

In step S120, an electrode supporting structure is formed on a side of the insulation layer away from the substrate. The electrode supporting structure has a plurality of through holes exposing each of the storage node contact plugs respectively; the through hole includes a plurality of hole segments end-to-end jointing successively, and the hole segment on a side close to the substrate has an aperture greater than the hole segment on a side away from the substrate, such that a space between walls of two adjacent through holes is greater on the side away from the substrate than the side close to the substrate.

Figure 5:
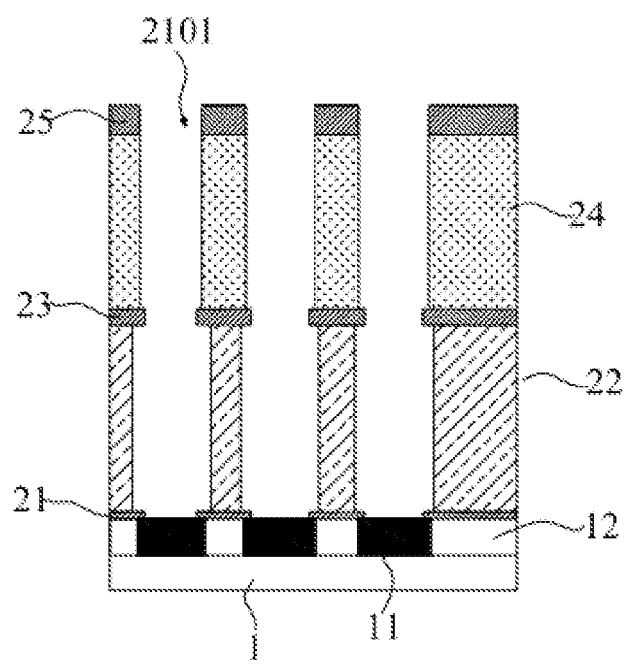
FIG. 5 is a schematic diagram of a through hole according to a first embodiment of the present disclosure.
Figure 6:
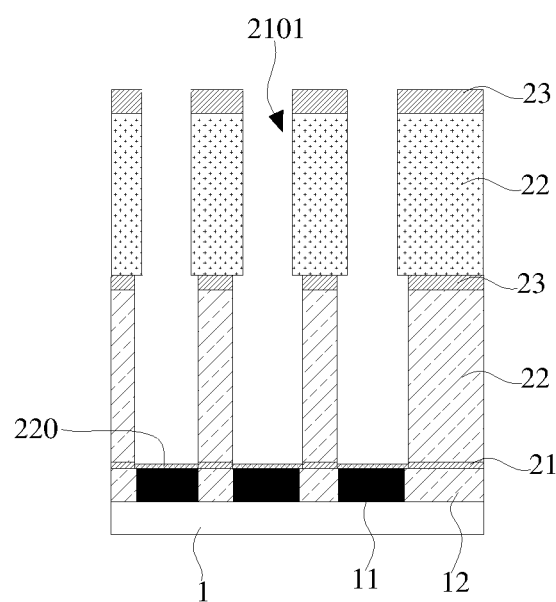
FIG. 6 is a schematic diagram of a through hole according to a second embodiment of the present disclosure.

The electrode supporting structure may be formed on a side of the insulation layer 12 away from the substrate 1, as shown in FIGS. 5 and 6. The electrode supporting structure may be used to support a first electrode layer 3 to prevent the first electrode layer 3 from deforming towards two sides thereof. The electrode supporting structure may have through holes 2101 exposing each of the storage node contact plugs 11. The through hole 2101 may run through the electrode supporting structure in a direction perpendicular to the electrode supporting structure, and a shape of a cross section thereof may be circular, rectangular or the like, and may also be irregular. The shape of the through hole 2101 is not specifically limited here. The through hole 2101 may be a stepped hole including a plurality of hole segments, among which a hole segment on a side close to the substrate 1 has an aperture greater than a hole segment on a side away from the substrate 1, such that a space between walls of two adjacent through holes is greater on the side away from the substrate than the side close to the substrate.

Figure 7:
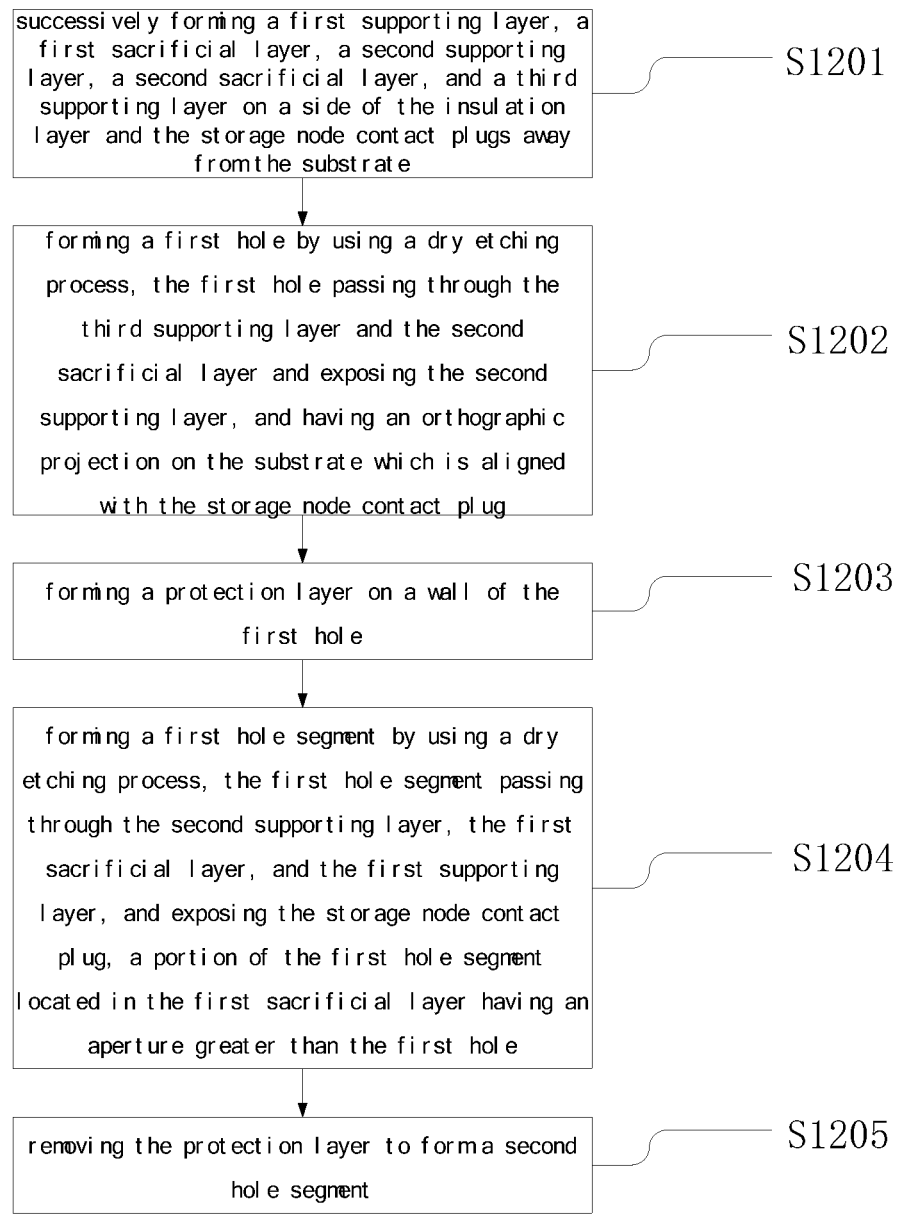
FIG. 7 is a flow diagram of a step 120 according to the first embodiment of the present disclosure.

In a first embodiment, as shown in FIG. 7, a step S120 may include steps S1201 to S1205 below.

Step S1201: successively forming a first supporting layer, a first sacrificial layer, a second supporting layer, a second sacrificial layer, and a third supporting layer on a side of the insulation layer and the storage node contact plugs away from the substrate.

Figure 8:
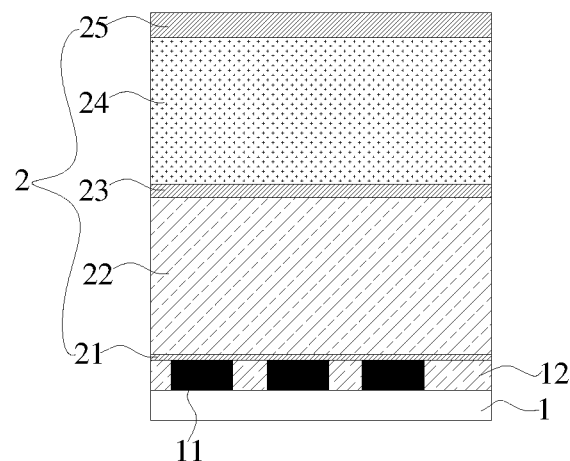
FIG. 8 is a schematic diagram corresponding to a completion of a step S1201 of FIG. 7.

As shown in FIG. 8, a first supporting layer 21, a first sacrificial layer 22, a second supporting layer 23, a second sacrificial layer 24, and a third supporting layer 25 may be successively formed on a side of the storage node contact plug 11 and the insulation layer 12 away from the substrate 1 by means of chemical vapor deposition or physical vapor deposition. The first supporting layer 21, the first sacrificial layer 22, the second supporting layer 23, the second sacrificial layer 24, and the third supporting layer 25 may also be formed by means of vacuum evaporation, magnetron sputtering or the like. This is not specifically limited here. The first supporting layer 21 may be a thin film formed on a side of the storage node contact plug 11 and the insulation layer 12 away from the substrate 1, and materials thereof may be $Si_3N_4$ or SiCN, and may have a thickness ranging from 20 nm to 200 nm. The first sacrificial layer 22 may be formed on a side of the first supporting layer 21 away from the substrate 1, and materials thereof may be $SiO_2$ processed using an organic solution (PGS, BPSG, TEOS or HDP), and may have a thickness ranging from 400 nm to 900 nm. The second supporting layer 23 may be formed on a side of the first sacrificial layer 22 away from the first supporting layer 21, have a same material as the first supporting layer 21, and may have a thickness ranging from 10 nm to 80 nm. The second sacrificial layer 24 may be formed on a side of the second supporting layer 23 away from the first sacrificial layer 22, and may have the same material and thickness as the first sacrificial layer 22. A top surface of the first sacrificial layer 22 and a top surface of the second sacrificial layer 24 may be polished using a chemical polishing process, so as to cause the first sacrificial layer 22 and the second sacrificial layer 24 to have a uniform and consistent thickness at all parts thereof. The third supporting layer 25 may be formed on a side of the second sacrificial layer 24 away from the second supporting layer 23, have the same material as the first supporting layer 21 and the second supporting layer 23, and may have a thickness ranging from 30 nm to 300 nm. It should be noted that the supporting layers may have a same thickness, and may have different thicknesses, which is not specifically limited here.

Step S1202: forming a first hole by using a dry etching process, the first hole passing through the third supporting layer and the second sacrificial layer and exposing the second supporting layer, and having an orthographic projection on the substrate which is aligned with the storage node contact plug.

Figure 9:
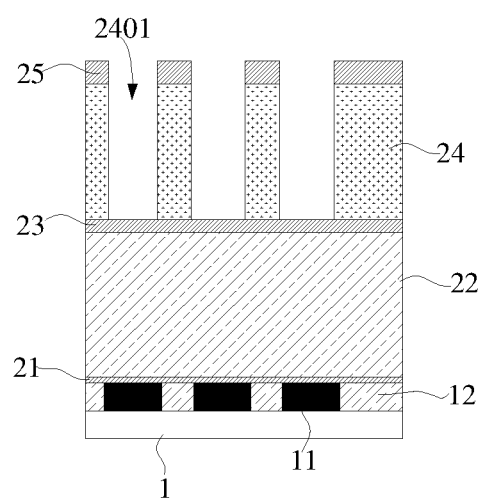
FIG. 9 is a schematic diagram corresponding to a completion of a step S1202 of FIG. 7.

A photoresist layer may be formed on the third supporting layer 25 by spinning or other methods. Materials of the photoresist layer may be a positive photoresist or a negative photoresist, which is not specifically limited here. A surface of the photoresist layer away from the third supporting layer 25 may have the same shape as a surface of the third supporting layer 25. As shown in FIG. 9, an exposure may be performed on the photoresist layer by using a mask, a pattern of which may match a desired pattern of a first hole 2401 and may have an orthographic projection on the substrate 1 which is aligned with the storage node contact plug 11. Then, the photoresist layer subjected to exposure may be developed to form a developed region. The developed region may expose the third supporting layer 25, a pattern thereof may match the desired pattern of the first hole 2401, and a size thereof may be the same as that the first hole 2401. The third supporting layer 25 and the second sacrificial layer 24 may be etched at the developed region by using dry etch, so as to expose the second supporting layer 23.

Step S1203: forming a protection layer on a wall of the first hole.

Figure 10:
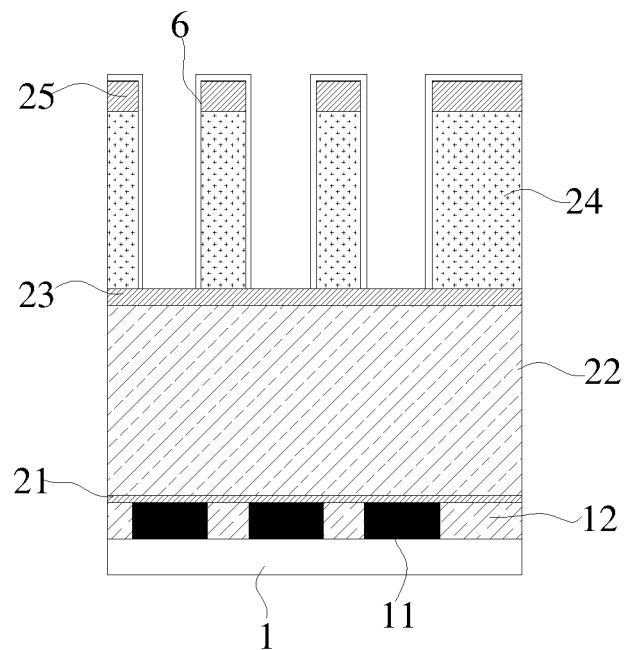
FIG. 10 is a schematic diagram corresponding to a completion of a step S1203 of FIG. 7.

As shown in FIG. 10, a protection layer 6 may be formed on a side wall of the first hole 2401 by means of vacuum evaporation or chemical vapor deposition. The protection layer 6 may be used to protect a surface of the third supporting layer 25 and a surface of the second sacrificial layer 24 which are exposed to surroundings, to protect them from being damaged during subsequent processes. The protection layer 6 may be made of a material of monocrystalline silicon, polycrystalline silicon, noncrystalline silicon or germanium silicon, and may have a thickness of 1 to 3 nm. The material and thickness of the protection layer 6 are not specifically limited here.

Step S1204: forming a first hole segment by using a dry etching process, the first hole segment passing through the second supporting layer, the first sacrificial layer, and the first supporting layer, and exposing the storage node contact plug, a portion of the first hole segment located in the first sacrificial layer having an aperture greater than the first hole.

Figure 11:
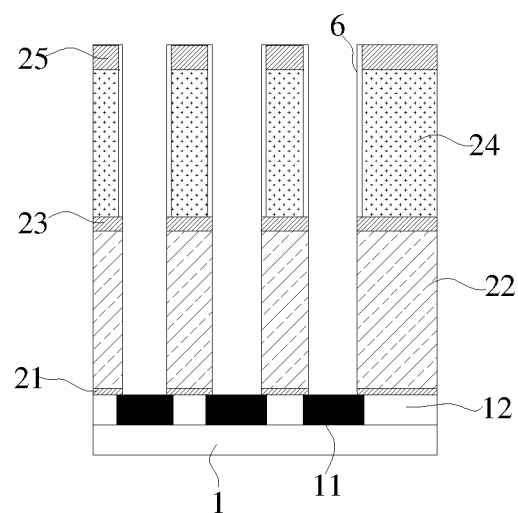
FIG. 11 is a schematic diagram corresponding to a completion of a step S1204 of FIG. 7.
Figure 12:
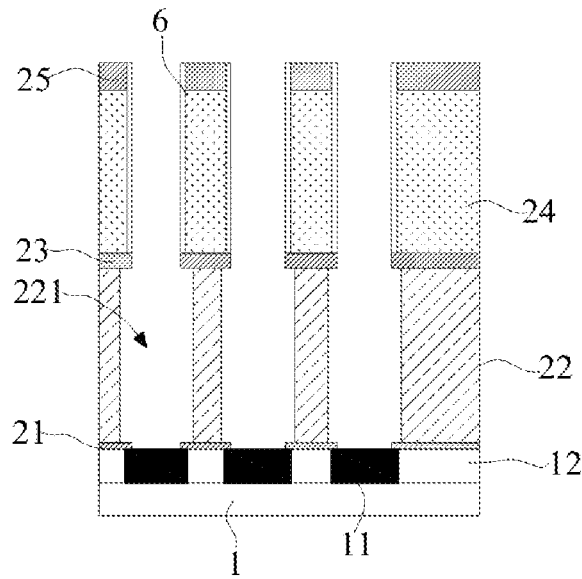
FIG. 12 is a schematic diagram corresponding to a completion of a step S1205 of FIG. 7.

As shown in FIGS. 11 and 12, the second supporting layer 23, the first sacrificial layer 22, and the first supporting layer 21 may be dry etched to form a first hole segment 221, i.e., the first hole segment 221 may pass through the second supporting layer 23, the first sacrificial layer 22, and the first supporting layer 21, and may expose the storage node contact plug 11. In order to increase capacitance, a chemical cleaning may be performed on an inner wall of the first hole segment 221, such that a portion of the first hole segment 221 which is located on the first sacrificial layer 22 has an aperture greater than the first hole 2401. After the first hole segment 221 is trepanned, an ashing process may be performed on a residual photoresist attached to a surface of the third supporting layer 25 to remove the photoresist.

For example, a solution of dilute hydrofluoric acid (DHF) may be used to perform chemical cleaning on the inner wall of the first sacrificial layer 22, so as to expand an opening of the first hole segment 221 which is located in the first sacrificial layer 22. For example, a mixed solution of HF and deionized water which has a concentration of 49% may be used to clean the first sacrificial layer 22, wherein a formulation ratio of HF to deionized water may be 1:500 to DHF to 1:2000, e.g., 1:500, 1:1000, 1:1500 or 1:2000. Certainly, other ratios may be used and may not be further enumerated here.

Step S1205: removing the protection layer to form a second hole segment.

The protection layer 6 may be removed by a wet etching process, and may be wet etched by using alkaline solutions, e.g., NH4OH or KOH, and the formulation ratio of the solution may be 1:5 to 1:100. The formulation ratio and concentration of the etching solution are not specifically limited here. As shown in FIG. 12, the second hole segment has an aperture less than the first hole segment 221, such that a through hole 2101 formed through end-to-end jointing the first hole segment 221 and the second hole segment has a greater aperture on a side close to the substrate 1 than a side away from the substrate 1.

In a second embodiment of the present disclosure, as shown in FIG. 6, the electrode supporting structure may include a plurality of stacked electrode supporting layers. Each of the electrode supporting layers may include a first supporting layer 21, a first sacrificial layer 22, and a second supporting layer 23, wherein the first supporting layer 21 may have a first opening exposing the storage node contact plug 11. The first sacrificial layer 22 may be located on a side of the first supporting layer 21 away from the substrate 1, and may be provided with a hole segment aligned with the first opening of the first supporting layer 21 exposing the storage node contact plug 11, and an end of the hole segment may be communicated with the first opening of the first supporting layer 21 exposing the storage node contact plug 11. The second supporting layer 23 may be located on a side of the first sacrificial layer 22 away from the insulation layer 12, and may have a hole communicated with the hole segment; the hole may be disposed to be aligned with the first opening of the first supporting layer 21.

The plurality of stacked electrode supporting layers may be formed on a side of the insulation layer 12 away from the substrate 1; in two adjacent electrode supporting layers, the second supporting layer 23 of an electrode supporting layer located close to the substrate 1 may be the same as first supporting layer 21 of an electrode supporting layer away from the substrate 1, and an opening of the second supporting layer 23 of the electrode supporting layer located close to the substrate 1 may be have the same structure as an opening of the first supporting layer 21 of the electrode supporting layer away from the substrate 1, such that a hole segment in the first sacrificial layer 22 of the electrode supporting layer located close to the substrate 1 is communicated with a hole segment in the first sacrificial layer 22 of the electrode supporting layer away from the substrate 1. It should be noted that, in two adjacent electrode supporting layers, the hole segment of the electrode supporting layer located on a side close to the substrate 1 has an aperture greater than the hole segment of the electrode supporting layer located on a side away from the substrate 1. For example, a number of the electrode supporting layers may be 2, 3, 4, 5 or 6. Certainly, other numbers may be possible, and the number of electrode supporting layers may be properly set based on practical requirements of a capacitor device and is not specifically limited here.

For example, as shown in FIG. 6, two electrode supporting layers are provided, including a first electrode supporting layer and a second electrode supporting layer, wherein:

the first supporting layer 21 of the first electrode supporting layer may be disposed on a side of the insulation layer 12 away from the substrate 1 and have an opening exposing the storage node contact plug 11; the first sacrificial layer 22 of the first electrode supporting layer is disposed on a side of the first supporting layer 21 away from the substrate 1 and has a first hole segment communicated with the opening of the insulation layer 12; the second supporting layer 23 of the first electrode supporting layer may be disposed on a side of the first sacrificial layer 22 away from the first supporting layer 21 and have a hole communicated with the first hole segment.

As shown in FIG. 6, the second electrode supporting layer is disposed on a side of the first electrode supporting layer away from the substrate 1; the second supporting layer 23 of the first electrode supporting layer may be simultaneously used as the first supporting layer 21 of the second electrode supporting layer, and the hole of the second supporting layer 23 of the first electrode supporting layer may be simultaneously used as an opening of the first supporting layer 21 of the second electrode supporting layer; the first sacrificial layer 22 of the second electrode supporting layer may be disposed on a side of the first supporting layer 21 of the second electrode supporting layer away from the substrate 1, and the first sacrificial layer 22 of the second electrode supporting layer may have a second hole segment therein which is connected to the opening of the first supporting layer 21 of the second electrode supporting layer, i.e., the second hole segment may be communicated with the first hole segment through the opening, and the first hole segment has an aperture greater than the second hole segment.

Figure 13:
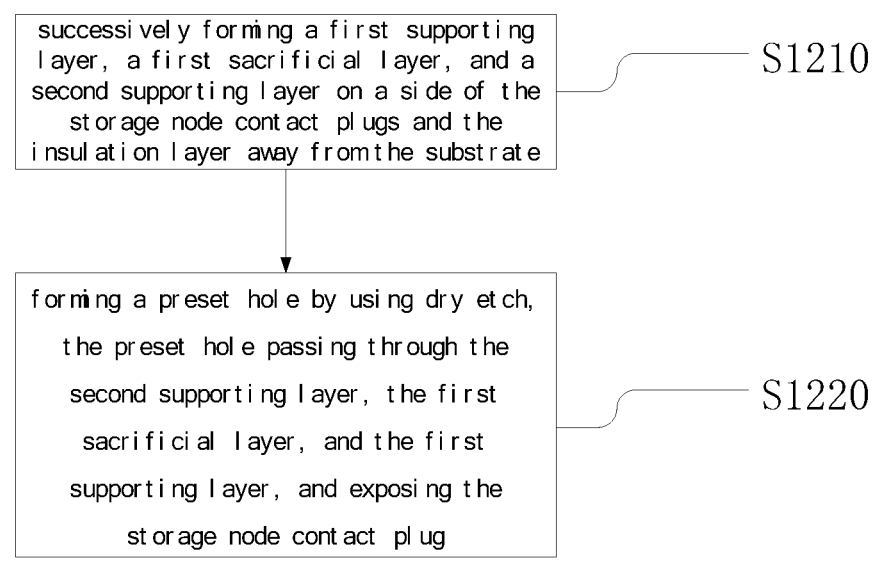
FIG. 13 is a flow diagram of a step 120 according to the second embodiment of the present disclosure.

As shown in FIG. 13, in the second embodiment of the present disclosure, the forming each of the electrode supporting layers may include steps S1210 to S1220 below.

Step S1210: successively forming a first supporting layer, a first sacrificial layer, and a second supporting layer on a side of the storage node contact plugs and the insulation layer away from the substrate.

Figure 14:
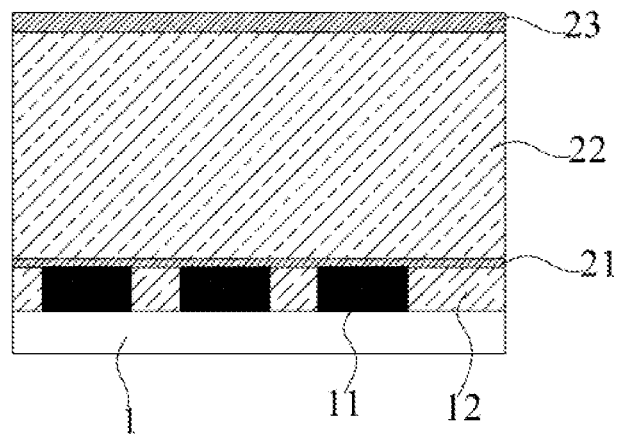
FIG. 14 is a schematic diagram corresponding to a completion of a step S1210 of FIG. 13.

As shown in FIG. 14, a first supporting layer 21 may be formed on a side of the storage node contact plug 11 and the insulation layer 12 away from the substrate 1 by means of chemical vapor deposition or physical vapor deposition. The first supporting layer 21 may also be formed by means of evaporation plating or magnetron sputtering. Certainly, the first supporting layer 21 may further be formed using other methods, which are not further enumerated here. The first supporting layer 21 may be a thin film formed on a side of the storage node contact plug 11 and the insulation layer 12 away from the substrate 1, may be made of $Si_3N_4$ or SiCN, and may have a thickness ranging from 20 nm to 200 nm, e.g., 20 nm, 50 nm, 100 nm, 150 nm or 200 nm. Certainly, other thicknesses may be possible, and the material and thickness of the first supporting layer 21 are not specifically limited here.

The first sacrificial layer 22 may be formed on a side of the first supporting layer 21 away from the substrate 1 by a vacuum evaporation or chemical vapor deposition process. The first sacrificial layer 22 may also be formed by other processes, which are not specifically limited here. The first sacrificial layer 22 may be a thin film formed on a side of the first supporting layer 21 away from the substrate 1, may be made of $SiO_2$ treated using organic solutions (PGS, BPSG, TEOS or HDP), and may have a thickness ranging from 400 nm to 900 nm, e.g., 400 nm, 500 nm, 600 nm, 700 nm, 800 nm or 900 nm. Certainly, other thicknesses may be possible, and the material and thickness of the first sacrificial layer 22 are not specifically limited here. A top surface of the first sacrificial layer 22 may be polished by using a chemical polishing process, such that the first sacrificial layer 22 has a uniform and consistent thickness at all parts thereof.

The second supporting layer 23 may be formed on a side of the first sacrificial layer 22 away from the substrate 1 by means of chemical vapor deposition or physical vapor deposition. The second supporting layer 23 may also be formed by means of evaporation plating or magnetron sputtering. Certainly, the second supporting layer 23 may further be formed using other methods, which are not further enumerated here. The second supporting layer 23 may be a thin film formed on a side of the first sacrificial layer 22 away from the substrate 1, may be made of $Si_3N_4$ or SiCN, and may have a thickness ranging from 50 nm to 150 nm, e.g., 50 nm, 80 nm, 120 nm or 150 nm. Certainly, other thicknesses may be possible, the material and thickness of the second supporting layer 23 are not specifically limited here, and the second supporting layer 23 may have the same thickness as the first supporting layer 21.

Step S1220: forming a preset hole by using dry etching, the preset hole passing through the second supporting layer, the sacrificial layer, and the first supporting layer, and exposing the storage node contact plug.

Figure 15:
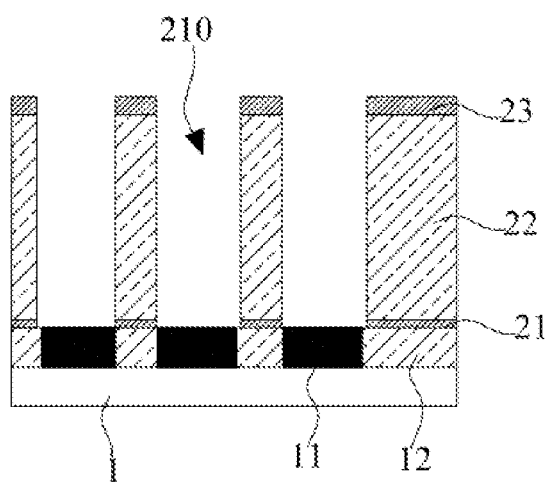
FIG. 15 is a schematic diagram corresponding to a completion of a step S1220 of FIG. 13.

A preset hole may be formed on the electrode supporting layer by a photolithography process, an exposure process, a trepanning process or an etching process, as shown in FIG. 15. The preset hole 210 may be aligned with the storage node contact plug 11 and have an orthographic projection on the substrate 1 which is coincided with a storage dielectric contact plug.

For example, a photoresist layer may be formed on the second supporting layer 23 by means of spinning or other manners. Materials of the photoresist layer may be a positive photoresist or a negative photoresist, which is not specifically limited here. A surface of the photoresist layer away from the second supporting layer 23 may have the same shape as a surface of the second supporting layer 23. An exposure may be performed on the photoresist layer by using a mask, a pattern of which may match a desired pattern of the preset hole 210. Then, the photoresist layer subjecting to exposure may be developed to form a developed region. The developed region may expose the second supporting layer 23, a pattern thereof may match the desired pattern of the preset hole 210, and a size thereof may be the same as that of the preset hole 210. The second supporting layer 23, the first sacrificial layer 22, and the first supporting layer 21 may be etched at the developed region by using dry etch, so as to expose the storage node contact plug 11.

Figure 16:
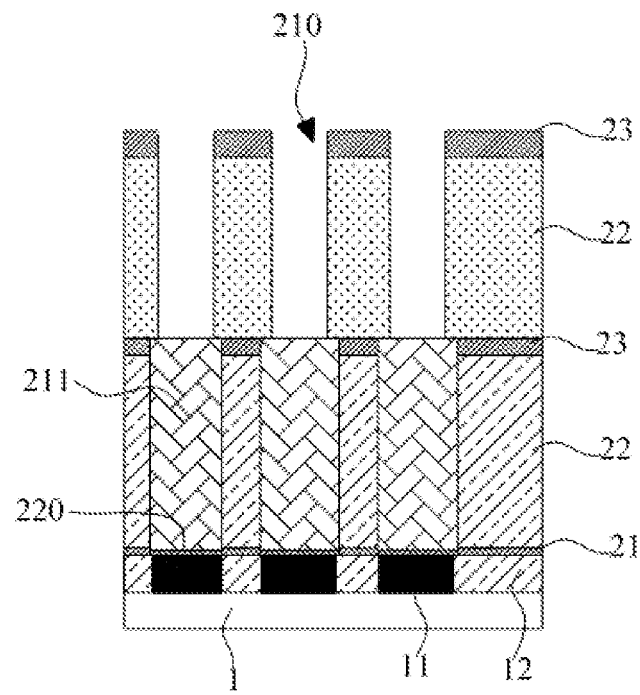
FIG. 16 is a schematic diagram of a preset hole of a second electrode supporting layer according to the second embodiment.

As shown in FIG. 16, during a formation of multiple electrode supporting layers, after a previous electrode supporting layer is formed, a blocking material 211 may be filled in a hole segment of the previous electrode supporting layer, so as to protect the hole segment of the previous electrode supporting layer from being damaged during the formation of a subsequent electrode supporting layer; after the formation of all of the electrode supporting layers with the electrode supporting structure, the blocking material 211 in the hole segment of each of the electrode supporting layers is removed to form a through hole 2101. The blocking material 211 may be filled at the opening of the hole segment, and may be filled and formed in the hole segment by the chemical vapor deposition process. The blocking material 211 may be titanium nitride, for example.

As shown in FIGS. 6 and 16, in order to protect a surface of the storage node contact plug 11 from being damaged during subsequent processes, a barrier layer 220 may be formed on the surface of the storage node contact plug 11; the barrier layer 220 may have a thickness less than or equal to the first supporting layer 21, and a material thereof may be titanium. The barrier layer 220 may be formed by the chemical vapor deposition process. Certainly, the barrier layer 220 may also be formed by other processes, which are not specifically limited here.

In step S130, a first electrode layer is formed in each of the through holes, and the first electrode layer is in a contact connection with the storage node contact plug.

Figure 17:
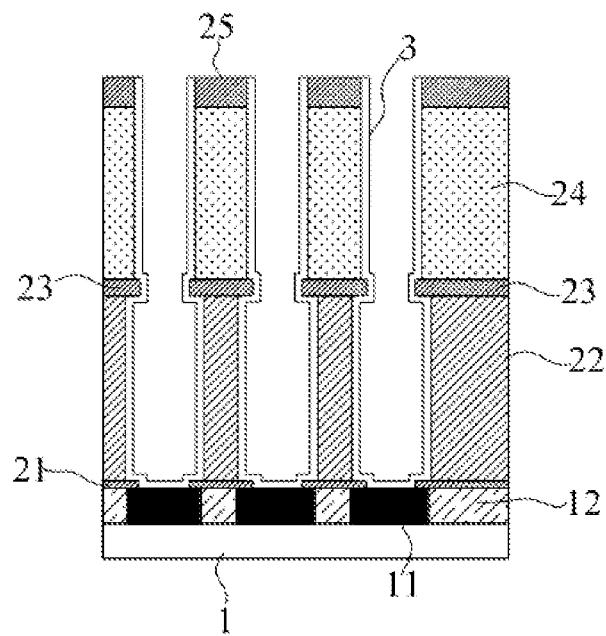
FIG. 17 is a schematic structural diagram of a first electrode layer according to an embodiment of the present disclosure.

As shown in FIG. 17, a first electrode layer 3, which follows a shape of and fit to a surface of the through hole 2101, may be formed in the through hole 2101; the first electrode layer 3 may be in a contact connection with the storage node contact plug 11 through the through hole 2101 to input electric energy stored in the first electrode layer 3 to the storage dielectric contact plug, thereby enabling capacitor storage. The first electrode layer 3 may be formed in the through hole 2101 by the chemical vapor deposition process. Certainly, the first electrode layer 3 may also be formed by other processes, which are not specifically limited here. A material of the first electrode layer 3 may be either titanium or tantalum, and may have a thickness of 4 nm to 10 nm, e.g., 4 nm, 6 nm, 8 nm or 10 nm. Certainly, the first electrode layer 3 may be made of other materials or may have other thicknesses, which are not further enumerated here.

In the first embodiment, after the first electrode layer is formed, the first supporting layer 21 of the electrode supporting structure may be overlaid on a surface of the insulation layer 12 and the storage node contact plug 11 away from the substrate 1, and may be connected to an outer side of the first electrode layer 3; the second supporting layer 23 may be located at an outer side of an end-to-end jointing part of two adjacent hole segments of the through hole 2101, and may annularly clad on an outer periphery of the first electrode layer 3 to support a middle portion of the first electrode layer 3, so as to prevent a short circuit phenomenon caused by an outward deformation of a side of the first electrode layer 3 away from the substrate during subsequent processes.

In a second embodiment, the electrode supporting structure includes multiple electrode supporting layers, and each of the electrode supporting layers includes a first supporting layer 21 and a second supporting layer 23; after the first electrode layer 3 is formed, the first supporting layer 21 may be overlaid on a side of the insulation layer 12 and the storage node contact plug 11 away from the substrate 1, and may be connected to an outer side of the first electrode layer 3; the second supporting layer 23 may be located on a side of the first supporting layer 21 away from the substrate 1, and may clad on an outer periphery of the first electrode layer; the first electrode layer 3 formed in two adjacent electrode supporting layers has a greater radial size on a side close to the substrate 1 than a side away from the substrate 1, such that a space between the first electrode layers 3 located in two adjacent through holes 2101 is greater on a side away from the substrate 1 than a side close to the substrate 1, i.e., the first electrode layers 3 located in two adjacent through holes 2101 would not contact each other even if they have a minor deformation, thereby avoiding short circuit.

Figure 18:
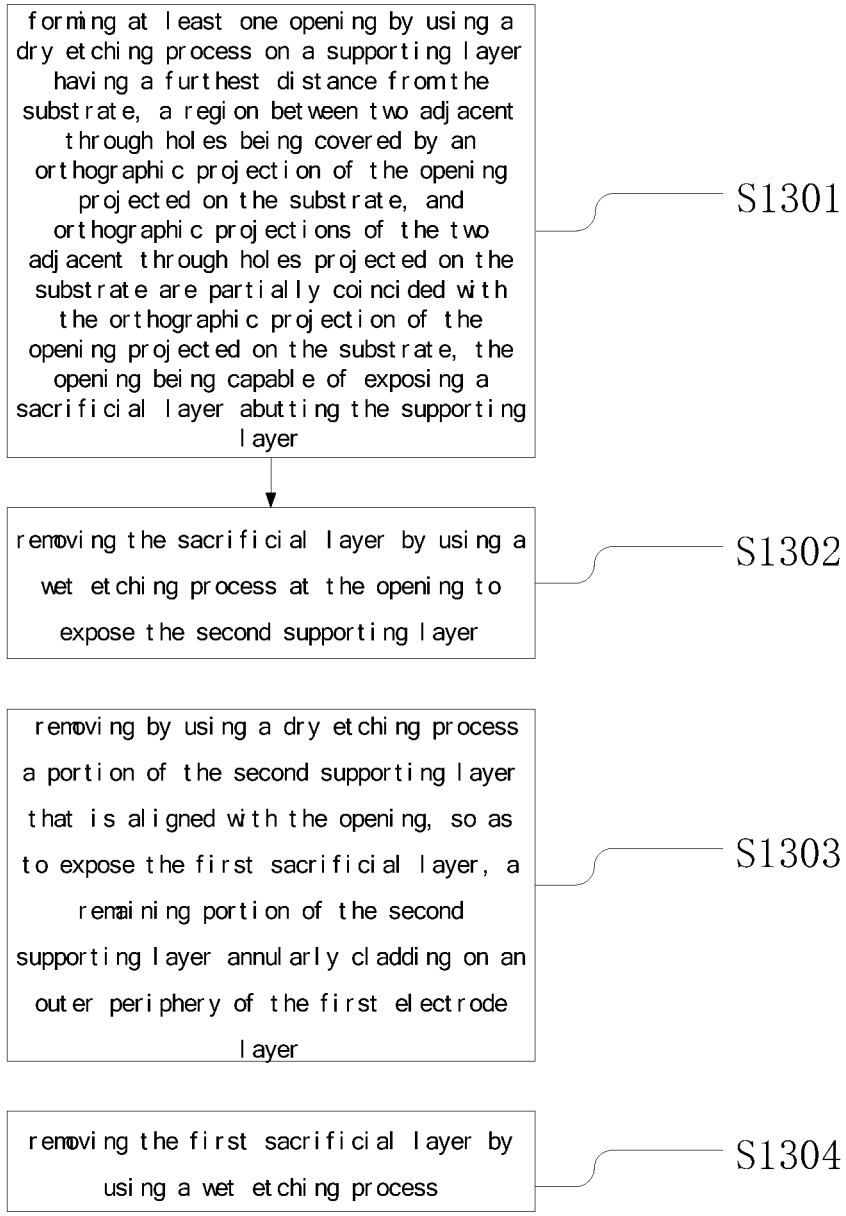
FIG. 18 is a flow diagram of removing a first sacrificial layer and a second sacrificial layer according to the first embodiment of the present disclosure.

In an embodiment of the present disclosure, after the first electrode layer 3 is formed and before the dielectric layer is formed, the manufacture method according to the present disclosure may further include following steps S1301 to S1304 as shown in FIG. 18.

Step S1301: forming at least one opening by using a dry etching process on a supporting layer having a furthest distance from the substrate, a region between two adjacent through holes being covered by an orthographic projection of the opening projected on the substrate, and orthographic projections of the two adjacent through holes projected on the substrate are partially coincided with the orthographic projection of the opening projected on the substrate, and the opening being capable of exposing a sacrificial layer abutting the supporting layer.

A mask material layer may be formed on a side, which faces away from the substrate 1, of the supporting layer having a furthest distance from the substrate 1 by means of chemical vapor deposition or other manners. The mask material layer may be overlaid on a side of the through hole 2101 away from the storage node contact plug 11. A material of the mask material layer may be at least one of silicon oxide, nitric oxide or carbon. Certainly, other materials may also be possible and may not be further enumerated here. The mask material layer may be of a single layer structure or a multilayer structure, which is not specifically limited here. A photoresist layer may be formed on the mask material layer by means of spinning or using other methods. Materials of the photoresist layer may be a positive photoresist or a negative photoresist, which is not specifically limited here.

An exposure may be performed on the photoresist layer by using a mask. A pattern of the mask may match a desired pattern of an opening located on the supporting layer having a furthest distance from the substrate 1. A region between two adjacent through holes may be covered by an orthographic projection of the opening projected on the substrate 1, and orthographic projections of the two adjacent through holes projected on the substrate 1 are partially coincided with the orthographic projection of the opening projected on the substrate 1. Then, the photoresist layer subjected to exposure may be developed to form a developed region. The developed region may expose the mask material layer. The mask material layer and the supporting layer having a furthest distance from the substrate 1 are etched at the developed region to form an opening. The opening may be a through hole, and a sacrificial layer abutting the supporting layer may be exposed through the opening.

Figure 19:
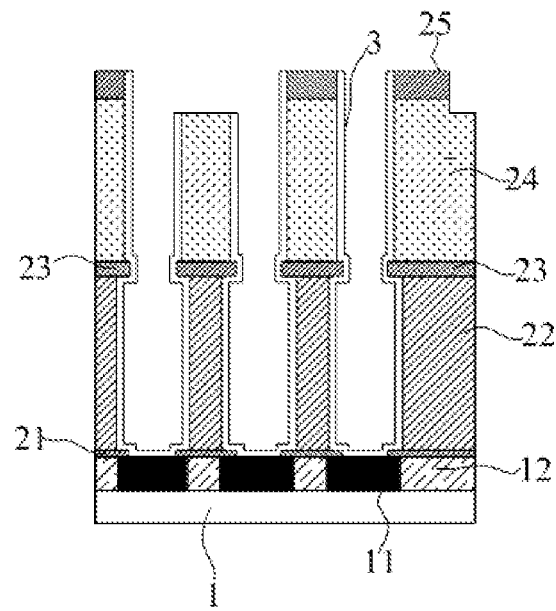
FIG. 19 is a schematic diagram corresponding to a completion of a step S1301 of FIG. 18.

After the opening is etched, an ashing process may be performed on the photoresist layer to remove the photoresist layer, and the mask material layer is removed by a dry etching process, such that the through hole and the supporting layer having a furthest distance from the substrate 1 are no longer covered by the mask material layer. Taking the first embodiment of the present disclosure as an example, a structure formed upon the completion of the step S1301 is illustrated in FIG. 19.

Step S1302: removing the sacrificial layer by using a wet etching process at the opening to expose the second supporting layer.

Figure 20:
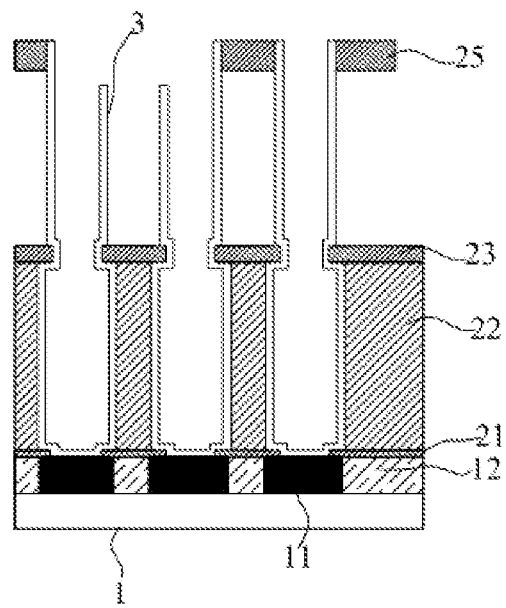
FIG. 20 is a schematic diagram corresponding to a completion of a step S1302 of FIG. 18.

The exposed sacrificial layer may be removed by a wet etching process, so as to expose the second supporting layer 23. The wet etch may be performed using acid solutions, such as hydrofluoric acid, e.g., buffered hydrofluoric acid (BHF), hydrofluoric acid having a concentration of 49% or diluted hydrofluoric acid (DHF). In the case where DHF is used as the etching solution, a formulation ratio of hydrofluoric acid to deionized water may be 1:1 to 1:10. The formulation ratio and concentration of the etching solution are not specifically limited here. Taking the first embodiment of the present disclosure as an example, a structure formed upon the completion of the step S1302 is illustrated in FIG. 20.

Step S1303: removing by using a dry etching process a portion of the second supporting layer that is aligned with the opening, so as to expose the first sacrificial layer, a remaining portion of the second supporting layer annularly cladding on an outer periphery of the first electrode layer.

Figure 21:
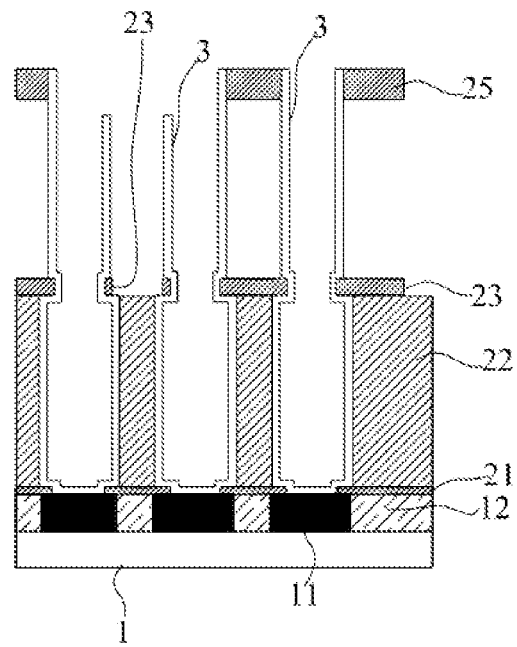
FIG. 21 is a schematic diagram corresponding to a completion of a step S1303 of FIG. 18.
Figure 22:
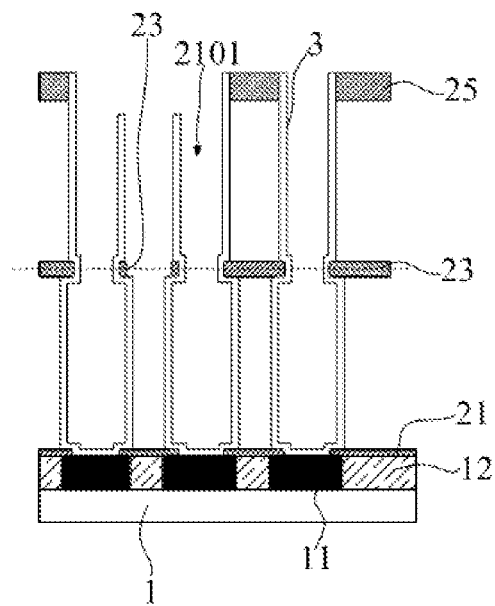
FIG. 22 is a schematic diagram corresponding to a completion of a step S1304 of FIG. 18.

A portion of the second supporting layer 23 that is aligned with the opening is removed by a dry etching process, so as to expose the first sacrificial layer 22; at this time, a remaining portion of the second supporting layer 23 may annularly clad on an outer periphery of the first electrode layer, and a middle portion of the first electrode layer 3 may be supported by the second supporting layer 23, avoiding a deformation of the first electrode layer under an effect of a surface tension of liquid when a wet etch is performed on the first sacrificial layer 22. Taking the first embodiment of the present disclosure as an example, a structure formed upon the completion of the step S1303 is illustrated in FIG. 21.

Step S1304: removing the first sacrificial layer by using a wet etching process.

Figure 23:
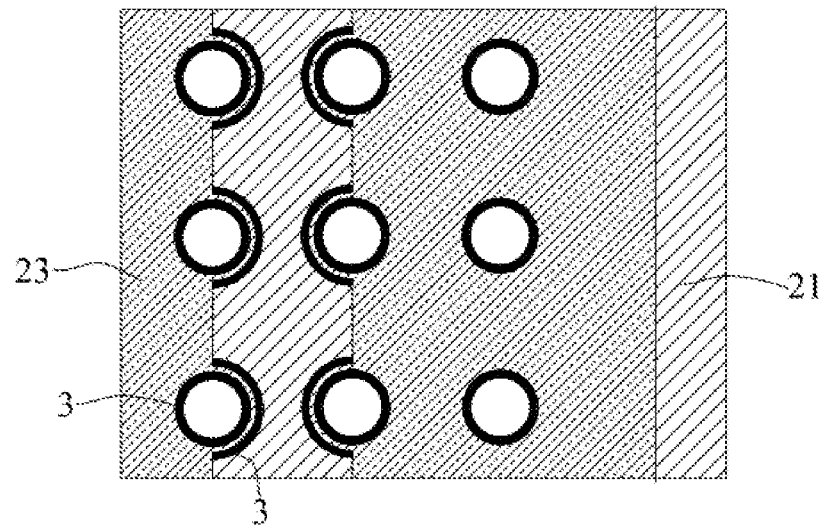
FIG. 23 is a top view corresponding to a cutaway along a dashed line of FIG. 22.

The first sacrificial layer 22 may be removed by a wet etching process, such that a final electrode supporting structure consists of the remaining of the first supporting layer 21, second supporting layer 23 and third supporting layer 25. Specifically, the wet etch may be performed using acid solutions, such as hydrofluoric acid, e.g., buffered hydrofluoric acid (BHF), hydrofluoric acid having a concentration of 49% or diluted hydrofluoric acid (DHF). In the case where DHF is used as the etching solution, a formulation ratio of hydrofluoric acid to deionized water may be 1:1 to 1:10. The formulation ratio and concentration of the etching solution are not specifically limited here. Taking the first embodiment of the present disclosure as an example, a structure formed upon the completion of the step S1304 is illustrated in FIG. 23.

In the second embodiment, the steps after the first electrode layer 3 is formed and before the dielectric layer is formed are similar to those of the first embodiment, and the difference lies in that: in step S1303, "removing by using a dry etching process a portion of the second supporting layer that is aligned with the opening, so as to expose the first sacrificial layer, a remaining portion of the second supporting layer annularly cladding on an outer periphery of the first electrode layer" is replaced with "removing the second supporting layer by a dry etching process to expose the first sacrificial layer"; during this procedure, the second supporting layer 23 may be entirely removed, and in the case where the electrode supporting structure 2 includes multiple electrode supporting layers, it may be possible to keep only the supporting layer located on a side closest to the substrate and the supporting layer located on a side furthest from the substrate. For convenience of differentiating from the first opening, the opening formed on the supporting layer furthest from the substrate may be referred to as a second opening.

Since the through hole 2101 includes a plurality of hole segments end-to-end jointing successively, a hole segment among the hole segments which is located on a side close to the substrate 1 has an aperture greater than a hole segment located away from the substrate 1, which can guarantee that a portion of the first electrode layer 3 close to the substrate 1 has an aperture greater than a portion of the first electrode layer 3 away from the substrate 1, and increase a lateral size between top portions of the first electrode layers 3 of two adjacent capacitors; as shown in FIG. 4, A is a spatial size between two adjacent capacitors, B is a size of a top portion of a capacitor having a high aspect ratio, and C is a size of a bottom portion of the capacitor having the high aspect ratio; with a large A, the spatial size between two adjacent capacitors may be increased, and the first electrode layer 3 may not contact an electrode of the adjacent capacitor even if the first electrode layer 3 deforms towards two sides thereof due to an effect of a subsequent process, avoiding short circuit; since a hole segment among the hole segments which is located on a side close to the substrate 1 has an aperture greater than a hole segment located away from the substrate 1, i.e., C is greater than B, such that the first electrode layer 3 which is formed on the surface thereof has a large the bottom size, which can increase a contact area between the first electrode and other layers, increasing the capacitance. Besides, the supporting layers of the electrode supporting structure 2 may clad on the outer peripheries of the first electrode layer 3. For example, the bottom portion of the first electrode layer 3 may be supported by the first supporting layer 21; the middle portion of the first electrode layer 3 may be supported by the second supporting layer 23, avoiding a deformation of the middle portion of the first electrode layer 3 due to an effect of an external force or a subsequent process; and the top portion of the first electrode layer 3 is supported by the third supporting layer 25, avoiding a deformation of the top portion of the first electrode layer 3 due to an effect of an external force or a subsequent process.

Step S140: forming a dielectric layer on outer and inner surfaces of a structure formed collectively by the first electrode layer and the electrode supporting structure.

Figure 24:
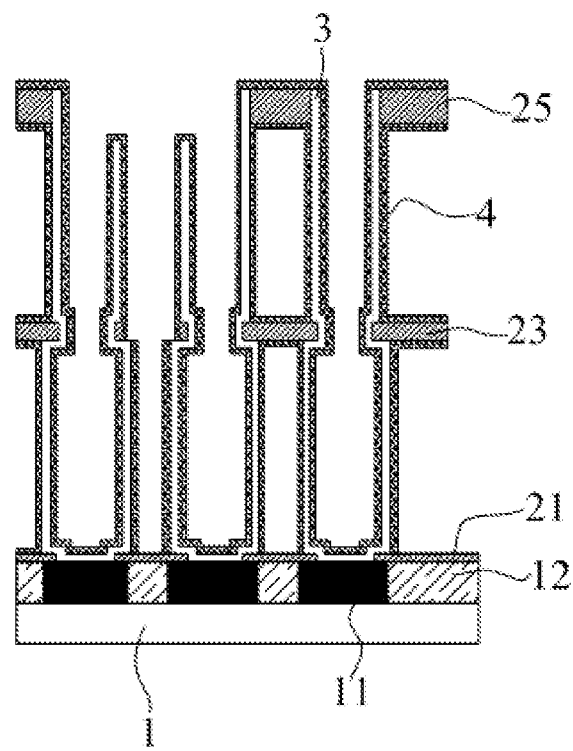
FIG. 24 is a schematic diagram of a dielectric layer according to an embodiment of the present disclosure.

As shown in FIG. 24, a dielectric layer 4 may be a thin film formed on outer and inner surfaces of a structure formed collectively by the first electrode layer 3 and the electrode supporting structure 2. The dielectric layer 4 may be formed by vacuum evaporation or magnetron sputtering. Certainly, the dielectric layer 4 may also be formed by other processes, which are not further enumerated here. The dielectric layer 4 may be of a structure of a single layer film made of the same material, or a structure of hybrid film layers which consists of film layers made of different materials. For example, the materials may include those of a high dielectric constant, such as aluminum oxide, hafnium oxide, lanthanum oxide, titanium oxide, zirconium oxide, tantalum oxide, niobium oxide, strontium oxide or a mixture thereof. Certainly, other materials may also be possible, and may not be further enumerated here.

In step S150, a second electrode layer is formed on an outer surface of the dielectric layer.

Figure 25:
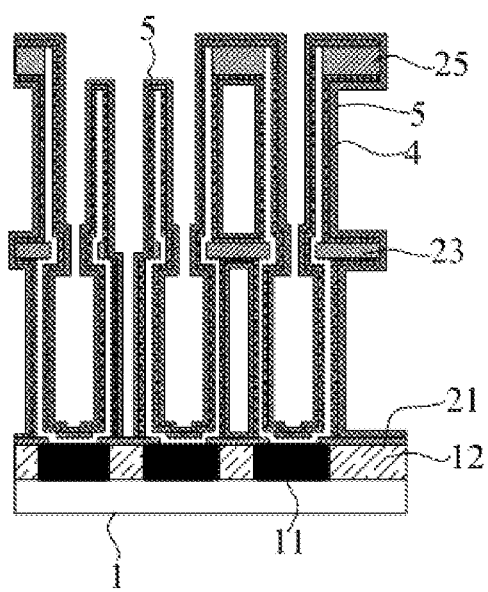
FIG. 25 is a schematic diagram of a second electrode layer according to an embodiment of the present disclosure.

As shown in FIG. 25, a second electrode layer 5 may be formed on an outer surface of the dielectric layer 4 by a chemical vapor deposition process. Certainly, the second electrode layer 5 may also be formed by other processes, which are not specifically limited here. A material of the second electrode layer 5 may be titanium nitride, and may have a thickness of 2 nm to 8 nm, e.g., 2 nm, 4 nm, 6 nm or 8 nm. Certainly, the second electrode layer 5 may be made of other materials or may have other thicknesses, which are not further enumerated here.

In order to improve an electrical conductivity of the device and enhance a stability of the capacitor structure, a semiconductor layer 7, with which the capacitor structures are covered, may be formed on a surface of the second electrode layer 5, as shown in FIG. 4. The interior of the through hole 2101 may be filled by the semiconductor layer 7 to enable charges to have sufficient contact with the second electrode, facilitating a charging efficiency of the capacitor. The semiconductor layer 7 may be made of silicon material, metal material or metallic compounds, e.g., silicon, germanium silicon, tungsten, titanium silicide, titanium oxide, tungsten oxide or the like, which is not specifically limited here.

The embodiments of the present disclosure further provide a capacitor device, as shown in FIG. 4; the capacitor device may include a substrate 1, an electrode supporting structure 2, a first electrode layer 3, a dielectric layer 4, and a second electrode layer 5, wherein:

a plurality of storage node contact plugs 11 arranged in an array and an insulation layer 12 separating each of the storage node contact plugs 11 may be formed on the substrate 1; the electrode supporting structure 2 may be formed on a side of the insulation layer 12 away from the substrate 1, and the electrode supporting structure 2 may have a plurality of through holes 2101 exposing the storage node contact plugs 11 respectively; the through hole 2101 may include a plurality of hole segments end-to-end jointing successively, a hole segment among hole segments which is located on a side close to the substrate 1 may has an aperture greater than a hole segment located on a side away from the substrate 1, such that a space between walls of two adjacent through holes is greater on the side away from the substrate than the side close to the substrate;

a first electrode layer 3 may be formed on each of the through holes 2101, and a first electrode layer 3 may be in a contact connection with the storage node contact plug 11;

a dielectric layer 4 may be formed on outer and inner surfaces of a structure formed collectively by the first electrode layer 33 and the electrode supporting structure 2; and a second electrode layer 5 may be formed on an outer surface of the dielectric layer 4.

Specific details of each part of the capacitor device described above have been elaborated in the method of manufacturing the capacitor device corresponding thereto. Thus, they are not further explained here.

The embodiments of the present disclosure further provide a semiconductor device, and the semiconductor device may include any one of the capacitor device described above. For a structure and beneficial effect of a capacitor device, please refer to the method of manufacturing the capacitor device and the capacitor device according to the embodiments described above, and they are not further described here. For example, the semiconductor device may be a Dynamic Random Access Memory (DRAM).

In a semiconductor device according to the present disclosure, on one hand, the electrode supporting structure may clad on the outer periphery of the first electrode layer and laterally support the first electrode layer, increasing an lateral stability of the first electrode layer and preventing the first electrode layer from a lateral deformation; on the other hand, since a hole segment of the hole segments on a side close to the substrate has an aperture greater than a hole segment on a side away from the substrate, such that in the first electrode layer formed in each of the through holes, a portion thereof close to the substrate has an aperture greater than a portion thereof away from the substrate, and then a space between the first electrodes formed in two adjacent through holes is greater on the side away from the substrate than the side close to the substrate, increasing a lateral space between two adjacent first electrode layers on a side away from the substrate; the first electrode layer would not contact an electrode located in the adjacent through hole even if subjected to a deformation towards both sides due to subsequent processes, avoiding short circuit; meanwhile, since the first electrode layer has a large size at its bottom, provided is an increased contact area between the first electrode and the dielectric layer, improving capacitance.

The person skilled in the art would readily envisage other embodiments of the present disclosure upon consideration of the specification and practice of the invention disclosed herein. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

What is claimed is:

1. A method of manufacturing a capacitor device, comprising:

forming, on a substrate, a plurality of storage node contact plugs distributed in an array and an insulation layer separating each of the storage node contact plugs;

forming an electrode supporting structure on a side of the insulation layer away from the substrate, the electrode supporting structure having a plurality of through holes exposing each of the storage node contact plugs respectively, the through holes comprising a plurality of hole segments sequentially end-to-end joint, an aperture of the hole segment located on a side close to the substrate is greater than an aperture of the hole segment located on a side away from the substrate, such that a space between walls of two adjacent through holes is greater on the side away from the substrate than the side close to the substrate;

forming a first electrode layer in each of the through holes, the first electrode layer being in a contact connection with the storage node contact plug;

forming a dielectric layer on outer and inner surfaces of a structure formed collectively by the first electrode layer and the electrode supporting structure; and forming a second electrode layer on an outer surface of the dielectric layer.

2. The method of manufacturing according to claim 1, wherein the forming an electrode supporting structure on a side of the insulation layer away from the substrate comprises:

successively forming a first supporting layer, a first sacrificial layer, a second supporting layer, a second sacrificial layer, and a third supporting layer on a side of the insulation layer and the storage node contact plugs away from the substrate;

forming a first hole by using a dry etching process, the first hole passing through the third supporting layer and the second sacrificial layer and exposing the second supporting layer, and having an orthographic projection on the substrate which is aligned with the storage node contact plug;

forming a protection layer on a wall of the first hole;

forming a first hole segment by using a dry etching process, the first hole segment passing through the second supporting layer, the first sacrificial layer, and the first supporting layer, and exposing the storage node contact plug, a portion of the first hole segment located in the first sacrificial layer having an aperture greater than the first hole; and removing the protection layer to form a second hole segment.

3. The method of manufacturing according to claim 1, wherein the forming an electrode supporting structure on a side of the insulation layer away from the substrate comprises:

forming, on a side of the insulation layer away from the substrate, a plurality of stacked electrode supporting layers, each of the electrode supporting layers comprising a first supporting layer, a first sacrificial layer, and a second supporting layer, the first supporting layer having a first opening exposing the storage node contact plug, the first sacrificial layer being located on a side of the first supporting layer away from the substrate and being provided with a hole segment aligned with the first opening, the second supporting layer being located on a side of the first sacrificial layer away from the insulation layer and having a hole communicated with the hole segment, the hole being disposed to be aligned with the first opening of the first supporting layer; and removing the first sacrificial layer after the first electrode layer is formed;

in two adjacent electrode supporting layers, a hole segment of the electrode supporting layer located on a side close to the substrate having an aperture greater than a hole segment of the electrode supporting layer located on a side away from the substrate.

4. The method of manufacturing according to claim 3, wherein the forming each of the electrode supporting layers comprises:

successively forming a first supporting layer, a first sacrificial layer, and a second supporting layer on a side of the storage node contact plugs and the insulation layer away from the substrate; and forming a preset hole by using dry etch, the preset hole passing through the second supporting layer, the first sacrificial layer, and the first supporting layer, and exposing the storage node contact plug.

5. The method of manufacturing according to claim 3, wherein in two adjacent electrode supporting layers, the second supporting layer of the electrode supporting layer located close to the substrate is the same as the first supporting layer of the electrode supporting layer away from the substrate.

6. The method of manufacturing according to claim 2, wherein after the first electrode layer is formed and before the dielectric layer is formed, the method of manufacturing further comprises:

forming at least one opening by using a dry etching process on a supporting layer having a furthest distance from the substrate, a region between two adjacent through holes being covered by an orthographic projection of the opening projected on the substrate, and orthographic projections of the two adjacent through holes projected on the substrate are partially coincided with the orthographic projection of the opening projected on the substrate, the opening being capable of exposing a sacrificial layer abutting the supporting layer;

removing the sacrificial layer by using a wet etching process at the opening to expose the second supporting layer;

removing by using a dry etching process a portion of the second supporting layer that is aligned with the opening, so as to expose the first sacrificial layer, a remaining portion of the second supporting layer annularly cladding on an outer periphery of the first electrode layer; and removing the first sacrificial layer by using a wet etching process.

7. The method of manufacturing according to claim 3, wherein after the first electrode layer is formed and before the dielectric layer is formed, the method of manufacturing further comprises:

forming at least a second opening by using a dry etching process on a supporting layer having a furthest distance from the substrate, a region between two adjacent through holes being covered by an orthographic projection of the second opening projected on the substrate, and orthographic projections of the two adjacent through holes projected on the substrate are partially coincided with the orthographic projection of the second opening projected on the substrate, the second opening being capable of exposing a sacrificial layer abutting the supporting layer;

removing the sacrificial layer by using a wet etching process at the second opening to expose the second supporting layer;

removing the second supporting layer by using a wet etching process to expose the first sacrificial layer; and removing the first sacrificial layer by using a wet etching process.

8. The method of manufacturing according to claim 4, wherein after the first electrode layer is formed and before the dielectric layer is formed, the method of manufacturing further comprises:

forming at least a second opening by using a dry etching process on a supporting layer having a furthest distance from the substrate, a region between two adjacent through holes being covered by an orthographic projection of the second opening projected on the substrate, and orthographic projections of the two adjacent through holes projected on the substrate are partially coincided with the orthographic projection of the second opening projected on the substrate, the second opening being capable of exposing a sacrificial layer abutting the supporting layer;

removing the sacrificial layer by using a wet etching process at the second opening to expose the second supporting layer;

removing the second supporting layer by using a wet etching process to expose the first sacrificial layer; and removing the first sacrificial layer by using a wet etching process.

9. The method of manufacturing according to claim 5, wherein after the first electrode layer is formed and before the dielectric layer is formed, the method of manufacturing further comprises:

forming at least a second opening by using a dry etching process on a supporting layer having a furthest distance from the substrate, a region between two adjacent through holes being covered by an orthographic projection of the second opening projected on the substrate, and orthographic projections of the two adjacent through holes projected on the substrate are partially coincided with the orthographic projection of the second opening projected on the substrate, the second opening being capable of exposing a sacrificial layer abutting the supporting layer;

removing the sacrificial layer by using a wet etching process at the second opening to expose the second supporting layer;

removing the second supporting layer by using a wet etching process to expose the first sacrificial layer; and removing the first sacrificial layer by using a wet etching process.

10. A capacitor device, comprising:

a substrate, a plurality of storage node contact plugs distributed in an array and an insulation layer separating each of the storage node contact plugs being formed on the substrate;

an electrode supporting structure formed on a side of the insulation layer away from the substrate, the electrode supporting structure having a plurality of through holes exposing the storage node contact plugs respectively, the through holes comprising a plurality of hole segments end-to-end jointing successively, the hole segment on a side close to the substrate having an aperture greater than the hole segment on a side away from the substrate, such that adjacent dielectric layers are formed on outer and inner surfaces of a structure collectively formed by a first electrode layer and the electrode supporting structure; and a second electrode layer formed on an outer surface of the dielectric layer.

11. The capacitor device according to claim 10, wherein the electrode supporting structure comprises a first supporting layer, a second supporting layer, and a third supporting layer, the first supporting layer being overlaid on a surface of the insulation layer and the storage node contact plug that faces away from the substrate and being connected to an outer side of the first electrode layer, the second supporting layer being located at an outer side of an end-to-end jointing part of two adjacent hole segments and annularly cladding an outer periphery of the first electrode layer, the third supporting layer being located on a side of the second supporting layer away from the first supporting layer and cladding the outer periphery of the first electrode layer.

12. The capacitor device according to claim 10, wherein the electrode supporting structure comprises multiple electrode supporting layers, each of the electrode supporting layers comprises a first supporting layer and a second supporting layer, the first supporting layer being overlaid on a side of the insulation layer and the storage node contact plug away from the substrate, and being connected to an outer side of the first electrode layer, the second supporting layer being located on a side of the first supporting layer away from the substrate and cladding an outer periphery of the first electrode layer; and a first electrode layer formed in two adjacent electrode supporting layers has a greater radial size on a side close to the substrate than a side away from the substrate.

13. The capacitor device according to claim 12, wherein in two adjacent electrode supporting layers, the second supporting layer of the electrode supporting layer located close to the substrate is the same as the first supporting layer of the electrode supporting layer away from the substrate.

14. A semiconductor device, comprising the capacitor device according to claim 10.

15. A semiconductor device, comprising the capacitor device according to claim 11.

16. A semiconductor device, comprising the capacitor device according to claim 12.

17. A semiconductor device, comprising the capacitor device according to claim 13.

* * * * *